United States Patent
Bertin et al.

(10) Patent No.: US 6,255,899 B1
(45) Date of Patent: Jul. 3, 2001

(54) METHOD AND APPARATUS FOR INCREASING INTERCHIP COMMUNICATIONS RATES

(75) Inventors: Claude L. Bertin, South Burlington; Anthony R. Bonaccio, Shelburne; Erik L. Hedberg, Essex Junction; Howard L. Kalter, Colchester; Thomas M. Maffitt, Burlington, all of VT (US); Jack A. Mandelman, Stormville, NY (US); Edward J. Nowak; William R. Tonti, both of Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/388,164

(22) Filed: Sep. 1, 1999

(51) Int. Cl.[7] .................................................. H01L 25/00
(52) U.S. Cl. ......................... 327/564; 327/566; 361/767; 361/783; 257/723
(58) Field of Search ..................................... 361/767, 768, 361/783, 760, 785; 257/723; 327/564–566

(56) References Cited

U.S. PATENT DOCUMENTS

| | | | |
|---|---|---|---|
| 4,630,096 | 12/1986 | Drye et al. ............................ | 361/401 |
| 5,200,810 | 4/1993 | Wojnarowski et al. ............... | 361/750 |
| 5,384,692 | * 1/1995 | Jaff ........................................ | 361/785 |
| 5,426,563 | * 6/1995 | Moresco et al. ...................... | 361/775 |
| 5,576,934 | 11/1996 | Roethlingshoefer et al. ........ | 361/761 |
| 5,615,089 | 3/1997 | Yoneda et al. ........................ | 257/723 |
| 5,712,767 | 1/1998 | Koizumi ................................ | 361/761 |
| 5,754,408 | 5/1998 | Derouiche ............................ | 361/773 |
| 5,757,070 | * 5/1998 | Fritz ....................................... | 257/723 |
| 5,760,478 | 6/1998 | Bozso et al. .......................... | 257/778 |
| 6,085,260 | * 7/2000 | Nelson ................................... | 710/20 |

* cited by examiner

*Primary Examiner*—Terry D. Cunningham
*Assistant Examiner*—Long Nguyen
(74) *Attorney, Agent, or Firm*—Dugan & Dugan; Eugene I. Shkurko; Peter W. Peterson

(57) ABSTRACT

An assembly is provided that includes an interposer having first and second substantially flat, opposed surfaces, and at least one speed critical signal line extending directly through the interposer from the first surface to the second surface. A first IC is coupled to the first surface of the interposer and has a first external connection mechanism coupled to the at least one speed critical signal line. A second IC is coupled to the second surface of the interposer and has a first external connection mechanism coupled to the at least one speed critical signal line. Preferably at least one non-speed critical signal line is provided within the interposer and is coupled to a second external connection mechanism of the first IC and/or the second IC for delivering non-speed critical signals thereto or for receiving such signals therefrom. A chip carrier having a cavity formed therein also may be provided wherein the second surface of the interposer is coupled to the chip carrier and the second IC is disposed within the cavity. One or more carrier signal lines may be provided within the chip carrier and coupled between the interposer and the second IC. The first and/or the second IC also may comprise control logic adapted to select a number of drivers within either IC that drive a particular signal line.

34 Claims, 6 Drawing Sheets

US 6,255,899 B1

METHOD AND APPARATUS FOR INCREASING INTERCHIP COMMUNICATIONS RATES

FIELD OF THE INVENTION

The present invention relates to semiconductor integrated circuits chips, and more specifically to a method and apparatus for increasing the frequency at which semiconductor integrated circuit chips may communicate (i.e., interchip communications rate).

BACKGROUND OF THE INVENTION

Semiconductor integrated circuit chips (hereinafter "IC chips") typically are mounted to and communicate via a chip carrier formed from a ceramic (e.g., alumina), an epoxy-glass (e.g., an organic epoxy) or a glass-ceramic. To allow interchip communications, metallic signal lines are provided within the chip carrier that interconnect the pads or pins of the chips mounted thereon.

Due to loading from a combination of chip/chip package resistance, inductance and capacitance, carrier mounted chips operating at high clock rates (e.g., about 500 MHZ to 1 GHZ) typically communicate with other carrier mounted chips at a maximum rate of about 50% of each chip's clock rate (e.g., about 250 MHZ to 500 MHZ). Often significantly lower communications rates must be employed at a significant bandwidth loss. Interchip wiring length differences also limit maximum interchip communications rates for carrier mounted chips (e.g., due to distortion/skew concerns). Accordingly, a need exists for a method and apparatus for increasing interchip communications rates.

SUMMARY OF THE INVENTION

To address the needs of the prior art, an inventive assembly is provided that comprises an interposer having first and second substantially flat, opposed surfaces, and at least one speed critical signal line (e.g., for delivering speed critical signals such as timing signals, data signals, address signals, etc.) extending directly through the interposer from the first surface to the second surface. The interposer may comprise a ceramic, an epoxy glass, a glass ceramic, silicon, silicon-on-insulator or any other suitable material.

A first IC is coupled to the first surface of the interposer and has a first external connection mechanism (e.g., a pin or a pad of the first IC) coupled to the at least one speed critical signal line. A second IC is coupled to the second surface of the interposer and has a first external connection mechanism coupled to the at least one speed critical signal line. Preferably at least one non-speed critical signal line is provided within the interposer and is coupled to a second external connection mechanism of the first IC and/or the second IC for delivering non-speed critical signals (e.g., power, ground, those between peripheral devices and the microprocessor, etc.) thereto or for receiving such signals therefrom.

A chip carrier having a cavity formed therein also may be provided wherein the second surface of the interposer is coupled to the chip carrier and the second IC is disposed within the cavity. One or more carrier signal lines may be provided within the chip carrier and coupled between the interposer and the second IC (e.g., for delivering signals therebetween). The first and/or the second IC also may comprise control logic adapted to select a number of drivers within either IC that drive a particular signal line (e.g., a speed critical signal line, a carrier signal line, a non-speed critical signal line, etc.).

Because of the short signal line length of the at least one speed critical signal line (e.g., the thickness of the interposer, preferably about 5 mm) and the low inductive, capacitive and resistive loading associated therewith, speed critical signals may be transferred across the at least one speed critical signal line at the maximum clock rate of the first IC and the second IC, and small, faster drivers may be employed. Skew rate also is reduced due to the short signal line length.

Other objects, features and advantages of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 1A:
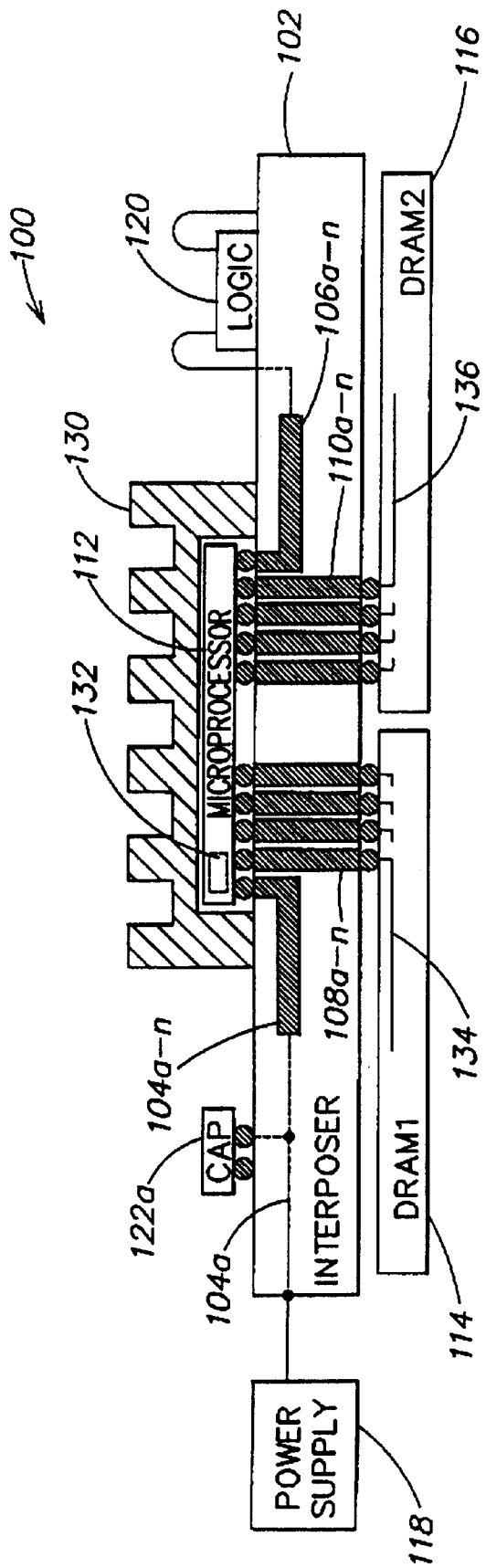
FIGS. 1A and 1B are a side elevational view and a top plan view, respectively, of a first chip mounting system configured in accordance with a first aspect of the present invention.
Figure 1B:
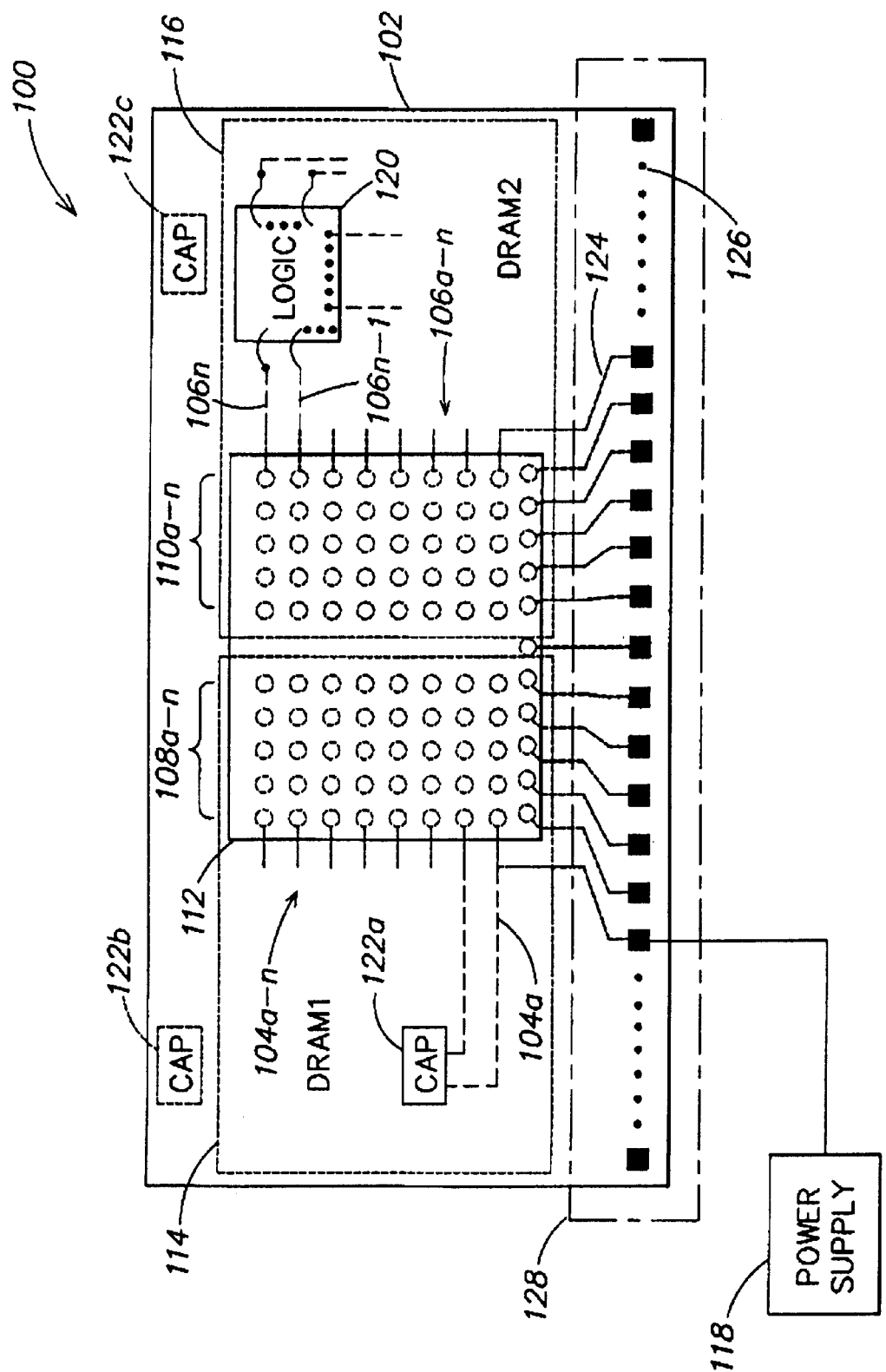

FIGS. 1A and 1B are a side elevational view and a top plan view, respectively, of a first chip mounting system 100 configured in accordance with a first aspect of the present invention. The first chip mounting system 100 comprises an interposer 102 for interconnecting and powering a plurality of chips via a plurality of non-speed critical signal lines 104a–n, 106a–n and via a first and second set of speed critical signal lines 108a–n and 110a–n, respectively.

For example, the interposer 102 is shown connecting a microprocessor 112 to a first dynamic random access memory (DRAM) 114 via the first set of speed critical signal lines 108a–n, to a second DRAM 116 via the second set of speed critical signal lines 110a–n, to a power supply 118 via the non-speed critical signal line 104a and to a logic chip 120 via the non-speed critical signal lines 106n, 106n-1. One or more decoupling capacitors (e.g., capacitors 122a–c) also may be coupled to the interposer 102 for decoupling purposes as is known in the art. The microprocessor 112, the first DRAM 114, the second DRAM 116, the power supply 118, the logic chip 120 and the capacitors 122a–c may be connected to the interposer 102 by any known connection technique such as via solder balls (e.g., Pb/Sn solder balls), wirebonds or the like. The interposer 102 further includes wiring 124 (FIG. 1B) for coupling to an external bus (not shown) via external connections 126 and via a conventional micro connector 128 (shown in phantom). One or more heat sinks (e.g., heat sink 130) may be coupled to the interposer 102 and to a chip coupled thereto (e.g., the microprocessor 112) for cooling the chip during the chip's operation.

The interposer 102 preferably comprises a ceramic material (e.g., alumina, with a co-efficient of thermal expansion (CTE) of about 6 ppm/° C.), an epoxy-glass (e.g., an organic epoxy-glass material with a CTE of about 15–18 ppm/° C.) or a glass-ceramic (e.g., with a CTE of about 3 ppm/° C.) having a thickness of about 5 mm, although other materials and other thicknesses may be employed (e.g., silicon or silicon-on-insulator). The first non-speed critical signal lines 104a–n and the second non-speed critical signal lines 106a–n preferably comprise metallic signal lines (e.g., copper) such as those used on conventional chip carriers for chip interconnection. On the contrary, the first set of speed critical signal lines 108a–n and the second set of speed critical signal lines 110a–n preferably comprise vias etched through the interposer 102 and back-filled with a conductive material (e.g., copper). Alternatively, co-axial type signal line connections through the interposer 102 (and/or through the microprocessor 112, the first DRAM 114 or the second DRAM 116) may be used to further decrease the loading associated with signal transfer via the first set of speed critical signal lines 108a–n and/or the second set of speed critical signal lines 110a–n. Co-axial type signal lines are described in U.S. patent application Ser. Nos. 09/265,098, filed Mar. 9, 1999 and 09/056,277, filed Apr. 7, 1998 both of which are hereby incorporated by reference herein in their entirety. Through holes also may be formed through the silicon substrate of one or more of the microprocessor 112, the first DRAM 114 and the second DRAM 116 to further reduce loading associated with high speed signal transfer therebetween. Such through holes are described in previously incorporated U.S. patent application Ser. No. 09/056, 277, filed Apr. 7, 1998.

With reference to FIG. 1A, the microprocessor 112, the first DRAM 114 and the second DRAM 116 are positioned so that speed critical signals (e.g., timing, address and data signals) can be communicated between the microprocessor 112 and the first DRAM 114 and between the microprocessor 112 and the second DRAM 116 via the first set of speed critical signal lines 108a–n and the second set of speed critical signal lines 110a–n, respectively. Because of the short distance between the microprocessor 112, the first DRAM 114 and the second DRAM 116 (e.g., about 5 mm) and the low inductive, capacitive and resistive loading associated with the first set of speed critical signal lines 108a–n and the second set of speed critical signal lines 110a–n, speed critical signals may be transferred across the first set of speed critical signal lines 108a–n and the second set of speed critical signal lines 110a–n at the maximum clock rate of the microprocessor 112, the first DRAM 114 and the second DRAM 116, and small, faster drivers may be employed. Skew rate also is reduced due to the short signal line lengths of the first set of speed critical signal lines 108a–n and second set of speed critical signal lines 110a–n.

Accordingly, unlike conventional microprocessors which employ reduced bandwidth (e.g., due to loading, skew, etc.) off-chip memory controllers for controlling the exchange of timing and address signals with memory chips, the memory control functions associated with the microprocessor 112 preferably are integrated within the microprocessor 112 (e.g., as represented by reference number 132 in FIG. 1A) to allow timing and address signals to be exchanged at the maximum rate between the microprocessor 112 and the first DRAM 114 and between the microprocessor 112 and the second DRAM 116. Further, because of the high communication rates between the microprocessor 112, the first DRAM 114 and the second DRAM 116, the first DRAM 114 and the second DRAM 116 may be provided with unique wiring to accommodate the higher communication bandwidths being employed. The unique wiring is in the input/output area of the DRAM memory chip. This unique wiring provides more than one signal path depending on the output loading requirements. If the loading is high, 50 pf for example, then the conventional pre-driver and output driver approach and corresponding wiring are used (e.g., via a first signal path). However, if the loading is light, 2–5 pf for example, then a much smaller driver may be used (e.g., via a second signal path). This second path has unique wiring on the DRAM, and in some cases some changes in the driver design, to accommodate this lower delay, higher frequency, lower power operating mode. While the above implementation has been discussed in terms of DRAM memory performance, the same approach may be used for any other memory, and for logic circuits as well. High bandwidth wiring within the first DRAM 114 and the second DRAM 116 is represented generally by reference numbers 134 and 136, respectively, in FIG. 1A. The I/O pads of the microprocessor 112, the first DRAM 114 and the second DRAM 116 also may be reconfigured if desired.

Non-speed critical signals such as those between peripheral devices and the microprocessor, power supply and ground preferably are distributed to or are transferred between the microprocessor 112, the first DRAM 114 and the second DRAM 116 (and the logic chip 120 if desired) via the first non-speed critical signal lines 104a–n and the second non-speed critical signal lines 106a–n at slower frequencies (e.g., half the maximum clock rate or lower). Note that the geometry shown in FIGS. 1A and 1B for the first chip mounting system 100 is merely preferred and that other geometries may be employed as described below with reference to FIGS. 1C and 1D. However, for any given geometry, chips preferably are aligned on opposite sides of the interposer 102 so that speed critical signal lines travel directly through the interposer 102 (e.g., so that speed critical signal line lengths are minimized).

Figure 1C:
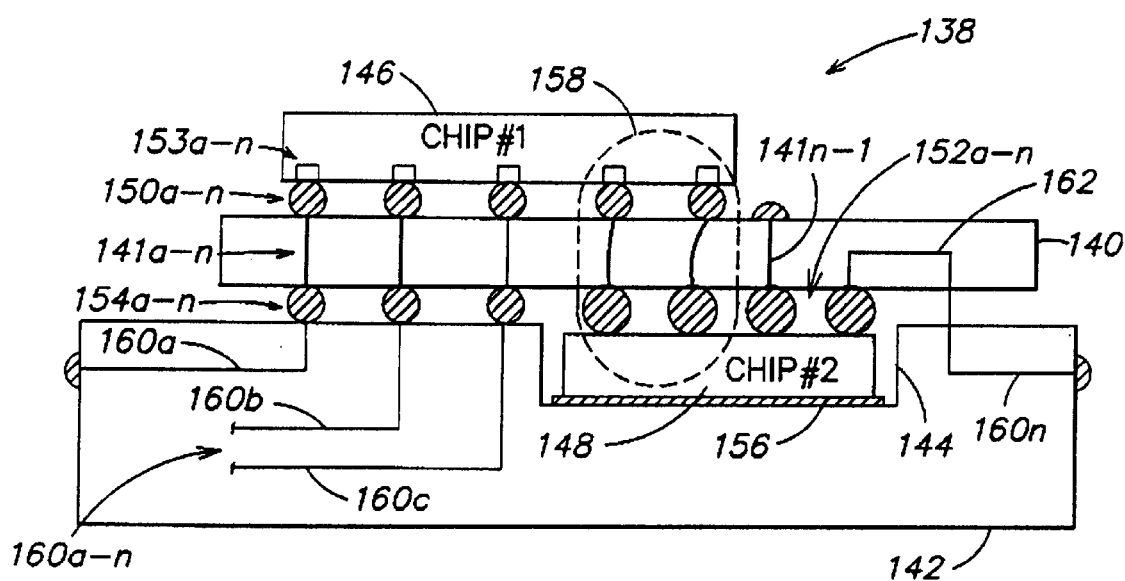
FIG. 1C is a side elevational view of a second chip mounting system configured in accordance with a second aspect of the present invention.

FIG. 1C is a side-elevational view of a second chip mounting system 138 configured in accordance with a second aspect of the present invention. The second chip mounting system 138 comprises an interposer 140 for connecting and powering a plurality of chips via a plurality of signal lines 141a–n. The signal lines 141a–n may comprise conventional metallic signal lines, backfilled vias and/or co-axial type connections as previously described. In addition to an interposer (e.g., interposer 140) the second chip mounting system 138 comprises a chip carrier 142 having a cavity 144 formed therein. The chip carrier 142 preferably comprises the same material as the interposer 140 (e.g., a ceramic, an epoxy-glass or a glass-ceramic material, silicon or silicon-on-insulator).

A first chip 146 (e.g., a microprocessor) is connected to the signal lines 141a–n at the top of the interposer 140 and a second chip 148 (e.g., a DRAM) is connected to the signal lines 141a–n at the bottom of the interposer 140 via a first and a second plurality of solder ball connections 150a–n and 152a–n, respectively, (e.g., Pb/Sn solder balls) as shown. For example, input, output and/or input/output pins, pads or other external connection mechanisms (represented generally by reference numbers 153a–n) of the first chip 146 may be coupled to the signal lines 141a–n as shown.

The interposer 140 is coupled to the chip carrier 142 via a third plurality of solder ball connections 154a–n and the second chip 148 is bonded to the chip carrier 142 via a bonding material 156 (e.g., an epoxy). The first chip 146 and the second chip 148 may be connected to the signal lines 141a–n of the interposer 140 by any other known connection techniques (e.g., via wirebonds) if desired. Note that the cavity 144 preserves the planarity of the second chip mounting system 138.

With reference to FIG. 1C, the first chip 146 and the second chip 148 are positioned so that speed critical signals (e.g., timing, address and data signals) can be communicated directly across the interposer 140 via the signal lines 141a–n (as indicated generally by the region 158 in FIG. 1C). Because of the short distance between the first chip 146 and the second chip 148 (e.g., about 5 mm) and the low inductance (e.g., <1 nh), capacitance (e.g., 2–5 pf) and resistance (e.g., a few milli-ohms) associated with the signal lines 141a–n, speed critical signals may be transmitted between the first chip 146 and the second chip 148 via the signal lines 141a–n within the region 158 at the maximum clock rate of the first chip 146 and the second chip 148. Smaller, faster output drivers also may be employed, and memory control functions may be integrated within a microprocessor connected to the interposer 140 as previously described (if desired). Speed critical signals may be transmitted to other chips (not shown) coupled to the interposer 140 by similarly positioning the chips opposite the first chip 146 or the second chip 148 (e.g., via the signal line 141n-1 in FIG. 1C). Synchronized DRAM (SDRAM) memories contain Delay Locked Loops (DLLs), as do memory controllers and microprocessors. These very high speed connections between chips permit high speed synchronization between memory and logic to further reduce delays and signal skews. Examples of the highest speed connections are shown in FIG. 1A, by reference numerals 108a–n and 110a–n, in region 158 of FIG. 1C, and in region 158 of FIG. 1D. While these are examples of the highest speed, most direct connections, other slower and more highly loaded connections will also benefit from synchronizing memory and logic DLLs.

Non-speed critical signals (e.g., f/2, f/3 or slower) preferably are transferred between the first chip 146, the second chip 148 and any other chips (not shown) coupled to the interposer 140 via one or more signal lines within the chip carrier 142 (e.g., internal signal lines 160a–n) and/or within the interposer 140 (e.g., internal signal line 162). The internal signal lines of the interposer 140 and the chip carrier 142 may be directly connected together as shown with reference to the internal signal line 162 of the interposer 140 and the internal signal line 160n of the chip carrier 142.

Figure 1D:
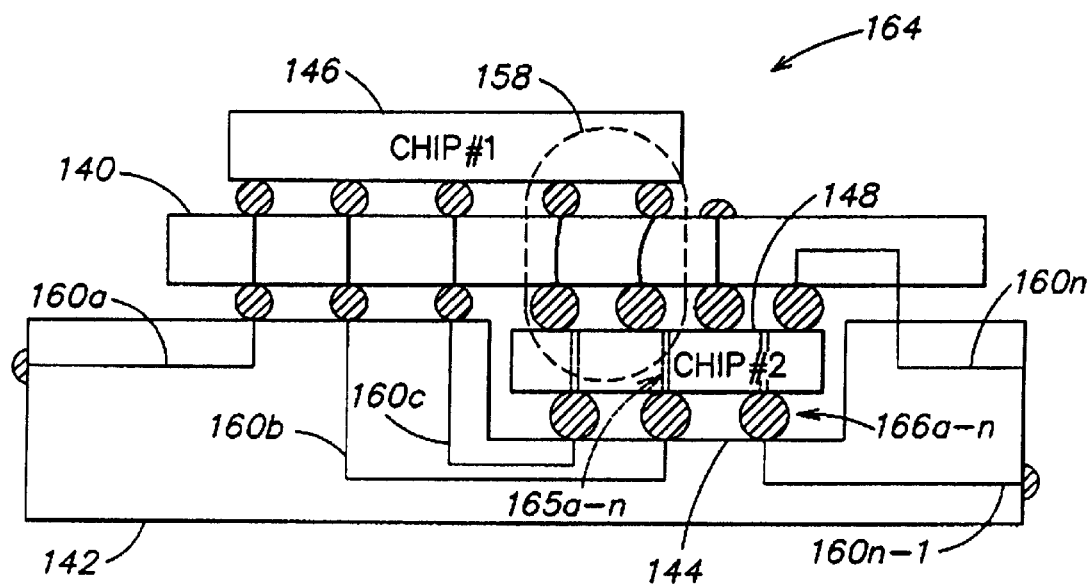
FIG. 1D is a side elevational view of a third chip mounting system configured in accordance with a third aspect of the present invention.

FIG. 1D is a side elevational view of a third chip mounting system 164 configured in accordance with a third aspect of the present invention. The third chip mounting system 164 of FIG. iD is similar to the second chip mounting system 138 with the exception that the silicon substrate of the second chip 148 is provided with through holes 165a–n to allow electrical connection on either side of the second chip 148, and the second chip 148 is coupled to the chip carrier 142 via a third plurality of solder ball connections 166a–n (or via other known connectors) rather than via the bonding material 156. By employing the third plurality of solder ball connections 166a–n, non-speed critical signal lines may be provided between the first chip 146 and the backside of the second chip 148 (e.g., via internal signal lines 160b and 160c) or to other chips (not shown) connected to the chip carrier 142 (e.g., via the internal signal line 160n-1). Greater chip placement flexibility and increased interconnectivity between chips thereby is provided. It will be understood that the particular geometries described with reference to FIGS. 1C and 1D are merely preferred and that additional or different signal line configurations may be similarly employed, and that additional cavities may be formed within the chip carrier 142 to accommodate other chips.

Because the load on the output drivers of chips (e.g., the microprocessor 112, the first DRAM 114 and the second DRAM 116 of FIGS. 1A and 1B, and the first chip 146 and the second chip 148 of FIGS. 1C and 1D) is significantly reduced over conventional chip carrier loadings when the first chip mounting system 100, the second chip mounting system 138 or the third chip mounting system 164 is employed (e.g., due to reduced signal line loading), preferably the output driver configuration employed to drive signals between the various chips interconnected via the first chip mounting system 100, the second chip mounting system 138 or the third chip mounting system 164 may be modified, if desired. The signal swings of output drivers contain two states, a high and a low voltage state. In cases where driver contention can occur, such as when multiple drivers share a bus, or even for dedicated point-to-point connections where data can flow in both directions, tri-state drivers are used. In addition to having the two states, high and low voltage, tri-state drivers have a high impedance state which permits other drivers to define the high or low voltage state of the common connection. In a typical application, both types of drivers are used depending on the function of the connection (e.g., address, data, timing, etc.). In the examples that follow, both output drivers and tri-state drivers are shown. More heavily loaded output drivers and tri-state drivers typically require pre-driver stages for amplification. For example, for heavily loaded signal lines such as the first non-speed critical signal lines 104a–n in FIG. 1A, the use of large, lower frequency tri-state drivers is preferred. However, for the first set of speed critical signal lines 108a–n or for the second set of speed critical signal lines 110a–n in FIG. 1A, the use of small, higher frequency predrivers or small, higher frequency tri-state drivers may be preferable (e.g., to obtain maximum interchip communication rates).

Figure 2A:
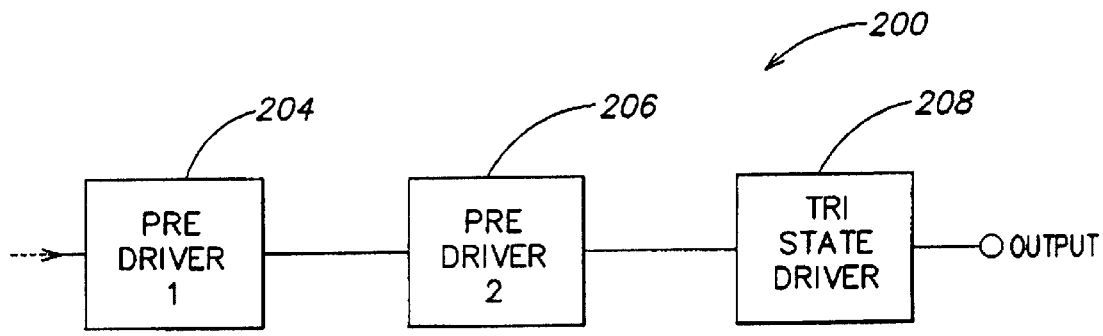
FIG. 2A is a schematic diagram of a wiring scheme employable when the output of a chip drives a heavily loaded signal line.

If it is known in advance (e.g., prior to chip fabrication) that a particular output of a chip will drive a signal line that is heavily loaded (e.g., either due to the load coupled to the signal line or due to the signal line itself having a heavy load associated therewith), the chip's output may be wired so as to be driven by a large output driver. FIG. 2A is a schematic diagram of a wiring scheme 200 employable when the output of a chip drives a heavily loaded signal line (e.g., one of the first non-speed critical signal lines 104a–n in FIG. 1A). Specifically, with the wiring scheme 200, on chip signals such as data signals from a memory array, address signals from a memory controller logic chip, etc., drive a first pre-driver 204, the output of the first pre-driver 204 drives a second pre-driver 206 and the output of the second pre-driver 206 drives by a first tri-state driver 208. The output 210 of the first tri-state driver 208 drives the off-chip load which may contain connections to multiple chips. By thus cascading the outputs of the drivers 204–208, a heavily loaded signal line (e.g., one of the first non-speed critical signal lines 104*a*–*n* in FIG. 1A) may be driven by the output 210. However, the rate (frequency) at which the off chip load may be driven is reduced, and time delays through driver stages reduce memory access time to data, introduce timing skews between signals, and increase power dissipation which can be avoided for lightly loaded outputs.

Figure 2B:
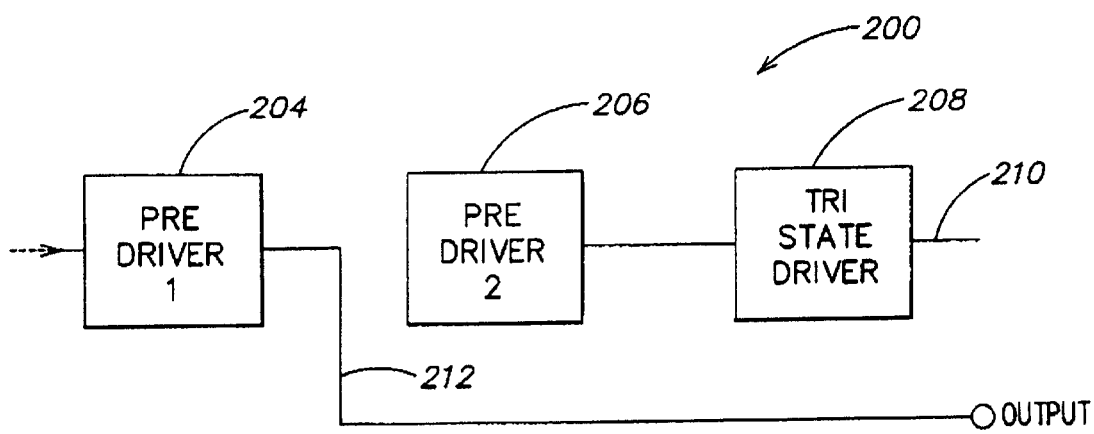
FIG. 2B is a schematic diagram of the wiring scheme of FIG. 2A rewired for use when the output of a chip drives a lightly loaded signal line.

Likewise, if it is known in advance that a particular output of a chip will drive a signal line that is lightly loaded (e.g., the first set of speed critical signal lines 108*a*–*n* or the second set of speed critical signal lines 110*a*–*n* of FIG. 1A), the chip's output may be wired to be driven by a small output driver. FIG. 2B is a schematic diagram of the wiring scheme 200 of FIG. 2A rewired for use when the output of a chip drives a lightly loaded signal line (e.g., the first set of speed critical signal lines 108*a*–*n* or the second set of speed critical signal lines 110*a*–*n* of FIG. 1A). Specifically, instead of cascading the outputs of the first pre-driver 204, the second pre-driver 206, and the tri-state driver 208 and using the output 210 of the tri-state driver 208 to drive a signal line, the wiring scheme 200 is rewired so that the output 212 of the first pre-driver 204 directly drives the signal line. A tri-state driver alternatively may be employed in place of the first pre-driver 204 if desired. By thus employing only the first pre-driver 204 to drive a signal line, the signal line may be driven at a significantly higher rate (frequency), with less time delay and lower power dissipation than with the configuration of FIG. 2A.

Figure 3A:
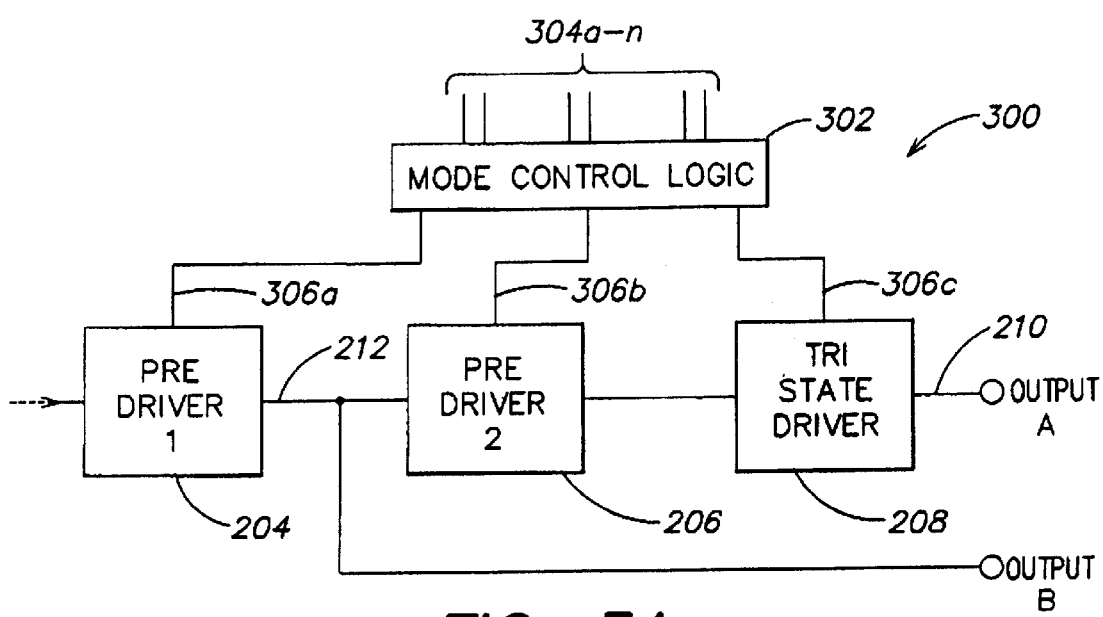
FIG. 3A is a schematic diagram of a first selectable output driver scheme that allows a chip's output to be adapted for driving a light or a heavy signal line load.
Figure 3B:
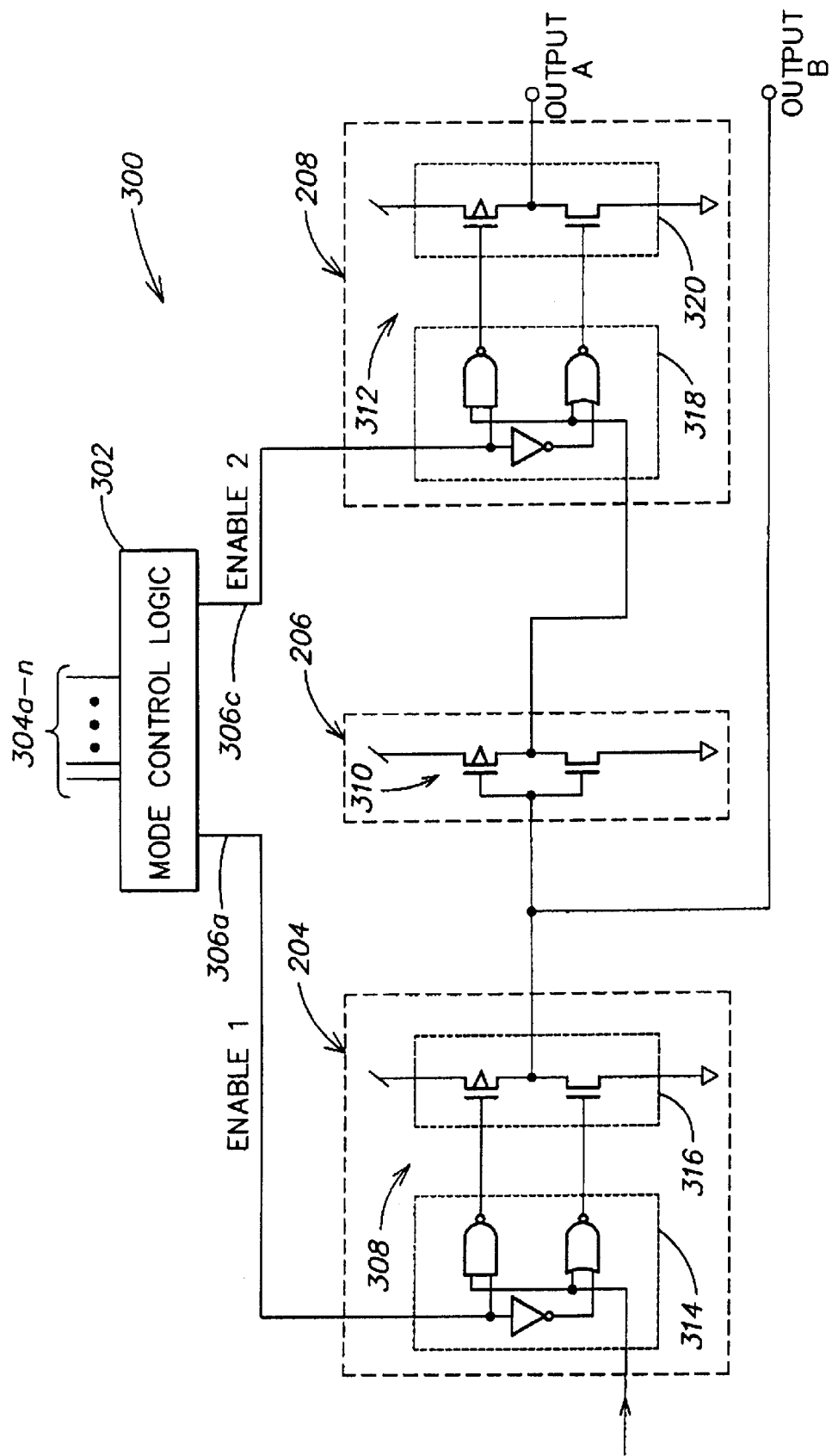
FIG. 3B is a schematic diagram of a preferred embodiment of the first selectable output driver scheme of FIG. 3A.

FIG. 3A is a schematic diagram of a first selectable output driver scheme 300 that allows a chip's output to be adapted for driving a light or a heavy signal line load. With reference to FIG. 3A, the first selectable output driver scheme 300 comprises the first pre-driver 204, the second pre-driver 206 and the tri-state driver 208 of FIGS. 2A and 2B in a cascaded configuration (similar to the wiring scheme 200 of FIG. 2A). The output 210 of the tri-state driver 208 serves as a first output A of the first selectable output driver scheme 300, and the output 212 of the first pre-driver 204 serves as a second output B of the first selectable output driver scheme 300. Additionally, the first selectable output driver scheme 300 comprises mode control logic 302 having a plurality of mode control inputs 304*a*–*n* and a plurality of mode control outputs 306*a*–*c* coupled to the first pre-driver 204, the second pre-driver 206 and the tri-state driver 208 as shown. Note that only the third mode control output 306*c* need be employed if the first pre-driver 204 and the second pre-driver 206 are not tri-statable drivers. The mode control logic 302 may comprise any known logic control circuit (e.g., a decoder circuit or other random logic). FIG. 3B is a schematic diagram of the preferred embodiment of the first selectable output driver scheme 300 of FIG. 3A wherein the first pre-driver 204 comprises a first tri-state driver 308, the second pre-driver 206 comprises a complimentary metal-oxide-semiconductor (CMOS) inverter 310 and the tri-state driver 208 comprises a second tri-state driver 312.

In operation, the first selectable output driver scheme 300 allows configuration of the output driver to drive an output A or an output B. The first pre-driver 204, the second pre-driver 206 and the first tri-state driver 208 are in a cascade configuration so as to form the output A, an output capable of driving heavy loads at reduced frequencies; the first pre-driver 204 alone forms the output B, an output capable of driving light loads at high frequencies. Both output A and output B may be tri-stated as described below.

To employ the output A (e.g., so as to drive heavy loaded signal lines such as the first non-speed critical signal lines 104*a*–*n* in FIG. 1A), the mode control inputs 304*a*–*n* are driven with logic levels that generate a high logic level on both the first mode control output 306*a* (ENABLE 1) and the third mode control output 306*c* (ENABLE 2). In response to the high logic level on the first mode control output 306*a*, enable circuitry 314 within the first tri-state driver 308 is enabled so that on chip signals are input to a CMOS inverter 316 within the first tri-state driver 308. The on chip signals thereby drive the CMOS inverter 316 (serving as the output B) and are input and drive the second pre-driver 206 (e.g., by the CMOS inverter 310).

In response to the high logic level on the third mode control output 306*c*, enable circuitry 318 within the second tri-state driver 312 is enabled so that the output of the second pre-driver 206 is input to a CMOS inverter 320 within the second tri-state driver 312. The output of the CMOS inverter 320 serves as the output A and may drive heavily loaded signal lines. Note that a significant advantage of the first selectable output driver scheme 300 of FIGS. 3A and 3B is that the first selectable output driver scheme 300 can simultaneously drive a heavily loaded signal line at a reduced frequency via the output A (e.g., a large load either on or off chip) and a lightly loaded signal line at a high frequency via the output B (e.g., a small load either on or off chip).

Figure 4:
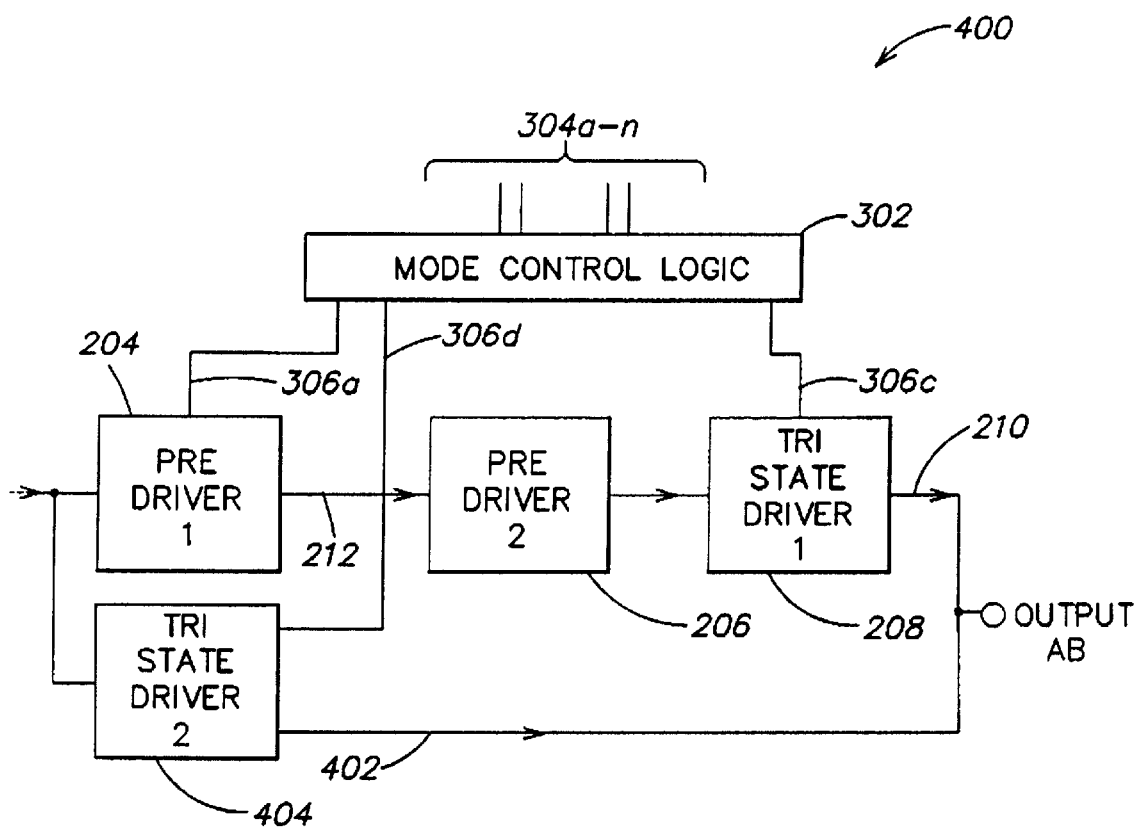
FIG. 4 is a schematic diagram of a second selectable output driver scheme that allows a chip's output to be adapted for driving a light or a heavy signal line load.

FIG. 4 is a schematic diagram of a second selectable output driver scheme 400 that allows a chip's output to be adapted for driving a light or a heavy signal line load. With reference to FIG. 4, the second selectable output driver scheme 400 is changed with respect to the first selectable output driver scheme 300 of FIG. 3A such that within the second selectable output driver scheme 400, the output 210 of the first tri-state driver 208 and an output 402 of a second tri-state driver 404 are connected together to form a single output AB.

In operation, the mode control logic 302 is driven with logic levels that enable the first tri-state driver 208, or the second tri-state driver 404. Only one of the first and second tri-state drivers 208, 404 may be enabled at a time because tri-state drivers 208 and 404 are both connected to the same output AB. For light loading on the output AB, the second tri-state driver 404 is enabled by a fourth mode control output 306*d* of the mode control logic 302, with the output 402 connected to the output AB, and the first tri-state driver 208 is placed in a tri-state (high impedance) mode by the third mode control output 306*c*. The first mode control output 306*a* prevents an input signal from activating the first pre-driver 204. This results in less delay (faster performance) and less power dissipation. For heavy loading on the output AB, the second tri-state driver 404 is placed in a tri-state mode by the fourth mode control output 306*d*. The first pre-driver 204 is activated by the first mode control output 306*a* and the input signal drives the first pre-driver 204. The output of the first pre-driver 204 drives the second pre-driver 206, the output of the second pre-driver 206 drives the first tri-state driver 208, and the output of the first tri-state driver 208 drives the output AB. The second pre-driver 206 does not require a mode control output because it is directly controlled by the first pre-driver 204. Note that the operation of the path employing the pre-drivers 204, 206 and the first tri-state driver 208 is slower, has longer delays, operates at a lower frequency, and dissipates more power than the path employing only the second tri-state driver 404. A significant advantage of the second selectable output driver scheme 400 is that a chip employing the second selectable output driver scheme 400 can be coupled to a signal line with no pre-knowledge of whether the signal line is heavily or lightly loaded. The appropriate driver circuitry (e.g., the second tri-state driver 404 only or the first pre-driver 204, the second pre-driver 206 and the first tri-state driver 208) thereafter may be dynamically selected as needed.

The foregoing description discloses only the preferred embodiments of the invention, modifications of the above disclosed apparatus and method which fall within the scope of the invention will be readily apparent to those of ordinary skill in the art. For instance, the speed critical and non-speed critical signal lines may be formed by any known fabrication technique.

Accordingly, while the present invention has been disclosed in connection with the preferred embodiments thereof, it should be understood that other embodiments may fall within the spirit and scope of the invention, as defined by the following claims.

The invention claimed is:

1. An assembly comprising:
    an interposer having two substantially flat opposed surfaces;
    at least two ICs each including a plurality of pins extending therefrom that are in electrical communications with the ICs;
    said at least two ICs each attached to one of said opposed surfaces and each having at least one pin directly connected through the interposer to at least one pin of the other IC for high speed data communication between said at least two ICs; and
    at least one of the ICs further having memory control logic integrated within said at least one of the ICs for selectively controlling an output driving capability through said at least one pin in response to a load presented through said at least one pin to said at least one of the ICs at a maximum clock rate to increase intercommunication between said at least two ICs.

2. The assembly of claim 1 wherein the control logic includes a means for adding an additional drive stage for driving said at least one pin.

3. An assembly comprising:
    an interposer having:
        a first substantially flat surface;
        a second substantially flat surface opposite the first surface;
        at least one signal line extending directly through the interposer from the first surface to the second surface;
        a first IC coupled to the first surface and having a first external connection mechanism coupled to the at least one signal line; and
        a second IC coupled to the second surface and having a first external connection mechanism coupled to the at least one signal line,
    wherein said at least one signal line extending there-through said interposer is adapted to deliver a signal at a maximum clock rate to increase intercommunication between said first IC and said second IC.

4. The assembly of claim 3 wherein the interposer comprises a material selected from the group consisting of a ceramic, an epoxy glass, a glass ceramic, silicon and silicon-on-insulator.

5. The assembly of claim 3 wherein the external connection mechanism comprises an external connection mechanism selected from the group consisting of an integrated circuit pin and an integrated circuit pad.

6. The assembly of claim 3 wherein the at least one signal line comprises a signal line selected from the group consisting of a backfilled via and a co-axial type signal line.

7. The assembly of claim 3 further comprising at least one signal line adapted to deliver a signal at half said maximum clock rate within the interposer coupled to a second external connection mechanism of the first IC.

8. The assembly of claim 7 wherein the at least one signal line adapted to deliver a signal at half said maximum clock rate comprises a signal line selected from the group consisting of a power line, a ground line and a signal line between a peripheral device and the first IC.

9. The assembly of claim 3 wherein the first IC comprises a dynamic random access memory and wherein the second IC comprises a microprocessor.

10. The assembly of claim 9 wherein the microprocessor includes memory control functions integrated therewithin.

11. The assembly of claim 3 further comprising control logic adapted to select a number of drivers within the first IC that drive the at least one signal line.

12. The assembly of claim 3 wherein the signal delivered from the at least one signal line comprises a signal line selected from the group consisting of a timing signal, an address signal, and a data signal.

13. The assembly of claim 7 wherein the signal delivered from the at least one signal line adapted to deliver a signal at half said maximum clock rate comprises a signal line selected from the group consisting of a power signal, a ground signal, and a signal between a peripheral component and a microprocessor.

14. A method of coupling a first IC to a second IC comprising:
    providing a first IC having a first external connection mechanism;
    providing a second IC having a first external connection mechanism;
    providing an interposer having first and second substantially flat opposed surfaces and at least one signal line that extends directly through the interposer from the first surface to the second surface;
    coupling the first IC to the first surface of the interposer and the first external connection mechanism of the first IC to the at least one signal line; and
    coupling the second IC to the second surface of the interposer and the first external connection mechanism of the second IC to the at least one signal line,
    wherein said at least one signal line extending there-through said interposer is adapted to deliver a signal at a maximum clock rate to increase intercommunication between said first IC and said second IC.

15. The method of claim 14 further comprising:
    providing at least one signal line adapted to deliver a signal at half said maximum clock rate within the interposer; and
    coupling a second external connection mechanism of the first IC to the at least one signal line adapted to deliver a signal at half said maximum clock rate.

16. The method of claim 14 further comprising adjusting a number of drivers within the first IC that drive the at least one signal line based on user selection.

17. An assembly comprising:
    an interposer having:
        a first substantially flat surface;
        a second substantially flat surface opposite the first surface; and
        at least one signal line extending directly through the interposer from the first surface to the second surface;
        a first IC coupled to the first surface and having a first external connection mechanism coupled to the at least one signal line;

a second IC coupled to the second surface and having a first external connection mechanism coupled to the at least one signal line; and a chip carrier having a cavity formed therein, wherein the second surface of the interposer is coupled to the chip carrier and the second IC is disposed within the cavity.

18. The assembly of claim 17 further comprising at least one carrier signal line within the chip carrier coupled to the second IC and to the interposer.

19. The assembly of claim 17 wherein said at least one signal line extending there-through said interposer is adapted to deliver a signal at a maximum clock rate to increase intercommunication between said first IC and said second IC.

20. The assembly of claim 19 wherein said at least one signal line extending there-through said interposer adapted to deliver a signal at a maximum clock rate comprises a signal line selected from the group consisting of a timing signal, an address signal, and a data signal.

21. The assembly of claim 17 wherein the interposer comprises a material selected from the group consisting of a ceramic, an epoxy glass, a glass ceramic, silicon and silicon-on-insulator.

22. The assembly of claim 17 wherein the external connection mechanism comprises an external connection mechanism selected from the group consisting of an integrated circuit pin and an integrated circuit pad.

23. The assembly of claim 17 wherein the at least one signal line comprises a signal line selected from the group consisting of a backfilled via and a co-axial type signal line.

24. The assembly of claim 17 further comprising at least one signal line adapted to deliver a signal at half said maximum clock rate within the interposer.

25. The assembly of claim 17 further comprising at least one signal line adapted to deliver a signal at half said maximum clock rate within the chip carrier.

26. The assembly of claim 17 wherein the first IC comprises a microprocessor and wherein the second IC comprises a dynamic random access memory.

27. An assembly comprising:
an interposer having:
a first substantially flat surface;
a second substantially flat surface opposite the first surface; and
at least one signal line extending directly through the interposer from the first surface to the second surface;
a first IC coupled to the first surface and having a first external connection mechanism coupled to the at least one signal line; said first IC further comprising:
a second external connection mechanism;
an IC output;
a first driver having an input coupled to the IC output of the first IC and an output coupled to the second external connection mechanism;
a second driver having an input coupled to the output of the first driver and an output coupled to the second external connection mechanism; and
control logic coupled to the second driver and adapted to selectively disable the second driver so that only the first driver drives the second external connection mechanism; and
a second IC coupled to the second surface and having a first external connection mechanism coupled to the at least one signal line.

28. The assembly of claim 27 wherein the input of the second driver is coupled to the output of the first driver via at least one additional driver.

29. The assembly of claim 27 wherein the first IC further comprises a third external connection mechanism, and wherein said second driver has said input coupled to the output of the first driver and said output coupled to the third external connection mechanism.

30. The assembly of claim 27 wherein said at least one signal line extending there-through said interposer is adapted to deliver a signal at a maximum clock rate to increase intercommunication between said first IC and said second IC.

31. A method of coupling a first IC to a second IC comprising:
providing a first IC having a first external connection mechanism;
providing a second IC having a first external connection mechanism;
providing an interposer having first and second substantially flat opposed surfaces and at least one signal line that extends directly through the interposer from the first surface to the second surface;
coupling the first IC to the first surface of the interposer and the first external connection mechanism of the first IC to the at least one signal line;
coupling the second IC to the second surface of the interposer and the first external connection mechanism of the second IC to the at least one signal line;
providing a chip carrier having a cavity formed therein; and
coupling the second surface of the interposer to the chip carrier so that the second IC is disposed within the cavity.

32. The method of claim 31 further comprising:
providing at least one carrier signal line within the chip carrier; and
coupling the at least one carrier signal line to the second IC and to the interposer.

33. The method of claim 31 wherein said at least one signal line extending there-through said interposer is adapted to deliver a signal at a maximum clock rate to increase intercommunication between said first IC and said second IC.

34. The method of claim 33 wherein said at least one signal line extending there-through said interposer adapted to deliver a signal at a maximum clock rate comprises a signal line selected from the group consisting of a timing signal, an address signal, and a data signal.

* * * * *